(12) United States Patent
Moore et al.

(10) Patent No.: US 6,348,365 B1
(45) Date of Patent: Feb. 19, 2002

(54) PCRAM CELL MANUFACTURING

(75) Inventors: John T. Moore; Terry L. Gilton, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/797,792

(22) Filed: Mar. 2, 2001

(51) Int. Cl.⁷ ................................................ H01L 21/82
(52) U.S. Cl. .......................... 438/130; 438/95; 438/466
(58) Field of Search ..................... 438/95, 130, 466–469

(56) References Cited

U.S. PATENT DOCUMENTS

| | | | |
|---|---|---|---|
| 5,751,012 A | * 5/1998 | Wolstenholme et al. | 257/5 |
| 5,761,115 A |   6/1998 | Kozicki et al. | 365/182 |
| 5,789,277 A | * 8/1998 | Zahorik et al. | 438/95 |
| 5,896,312 A |   4/1999 | Kozicki et al. | 365/153 |
| 5,914,893 A |   6/1999 | Kozicki et al. | 365/107 |
| 6,084,796 A |   7/2000 | Kozicki et al. | 365/153 |

* cited by examiner

Primary Examiner—Jey Tsai

(57) ABSTRACT

An exemplary embodiment of the present invention includes a method for forming a programmable cell by forming an opening in a dielectric material to expose a portion of an underlying first conductive electrode, forming a recessed chalcogenide-metal ion material in the opening and forming a second conductive electrode overlying the dielectric material and the chalcogenide-metal ion material. A method for forming a recessed chalcogenide-metal ion material comprises forming a glass material to be recessed approximately 50% or less, in the opening in the dielectric material, forming a metal material on the glass material within the opening and diffusing metal ions from the metal material into the glass material by using ultraviolet light or ultraviolet light in combination with a heat treatment, to cause a resultant metal ion concentration in the glass material.

25 Claims, 2 Drawing Sheets

PCRAM CELL MANUFACTURING

FIELD OF THE INVENTION

This invention relates to semiconductor fabrication processing and more particularly, to methods for forming programmable capacitor dynamic random access memories (PCRAMs) utilizing a programmable metallization cell.

BACKGROUND OF THE INVENTION

Memory devices are used in electronic systems and computers to store information in the form of binary data. These memory devices may be characterized as either volatile memory, where the stored data is lost if the power source is disconnected or removed or non-volatile, where the stored data is retained even during power interruption. An example of a non-volatile memory device is the programmable conductor random access memory (PCRAM) that utilizes a programmable metallization cell (PMC).

A PMC comprises a fast ion conductor such as a chalcogenide-metal ion and at least two electrodes (e.g., an anode and a cathode) comprising an electrically conducting material and disposed at the surface of the fast ion conductor a set distance apart from each other. When a voltage is applied to the anode and the cathode, a non-volatile metal dendrite rapidly grows from the cathode along the surface of the fast ion conductor towards the anode. The growth rate of the dendrite is a function of the applied voltage and time; the growth of the dendrite may be stopped by removing the voltage or the dendrite may be retracted back towards the cathode, or even disintegrated, by reversing the voltage polarity at the anode and cathode. Changes in the length and width of the dendrite affect the resistance and capacitance of the PMC.

One of the important elements of the PMC is the fast ion conductor, which plays a critical part during the programming of the PMC. The construction of the fast ion conductor is key to providing effective and reliable programming of the PMC and is a significant focus of the present invention.

Thus, the present invention comprises fabrication techniques to form a programmable metallization cell, for use in a programmable conductor random access memory, that will become apparent to those skilled in the art from the following disclosure.

SUMMARY OF THE INVENTION

An exemplary embodiment of the present invention includes a method for forming a programmable cell by forming an opening in a dielectric material to expose a portion of an underlying first conductive electrode, forming a recessed chalcogenide-metal ion material in the opening and forming a second conductive electrode overlying the dielectric and the chalcogenide-metal ion material.

A method for forming a recessed chalcogenide-metal ion material comprising forming a glass material being recessed approximately 500% or less, in the opening in the dielectric forming a metal material on the glass material and diffusing metal ions from the metal material into the glass material by using ultraviolet light or ultraviolet light in combination with a heat treatment, to cause a resultant metal ion concentration in the glass material.

DESCRIPTION OF THE INVENTION

An exemplary implementation of the present invention is directed to a process for forming a programmable metallization cell (PMC) for a PCRAM device as depicted in FIGS. 1–6.

The following exemplary implementation is in reference to the fabrication of programmable conductor random access memory (PCRAM) device. While the concepts of the present invention are conducive to the fabrication of PCRAMs, the concepts taught herein may be applied to other semiconductor devices that would likewise benefit from the use of the process disclosed herein. Therefore, the depiction of the present invention in reference to the manufacture of a PCRAM (the preferred embodiment), is not meant to so limit the extent to which one skilled in the art might apply the concepts taught hereinafter.

Figure 1:
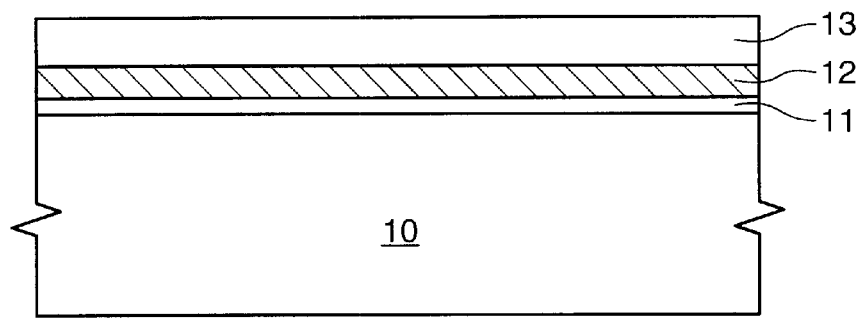
FIG. 1 is a cross-sectional view depicting a semiconductor substrate covered with layers of silicon dioxide, tungsten, which forms the first conductor of the programmable metallization cell, and silicon nitride.

Referring to FIG. 1, a semiconductive substrate 10, such as a silicon wafer, is prepared for the processing steps of the present invention. As described above, a PMC may be implemented in various different technologies. One such application is in memory devices. Insulating material 11, such as silicon dioxide, is formed over substrate 10. Next, conductive material 12, such as tungsten, is formed over insulating material 11. Conductive material 12 will function as one of the conductive electrodes of the PMC. Next, dielectric material 13, such as silicon nitride, is formed over conductive material 12.

Figure 2:
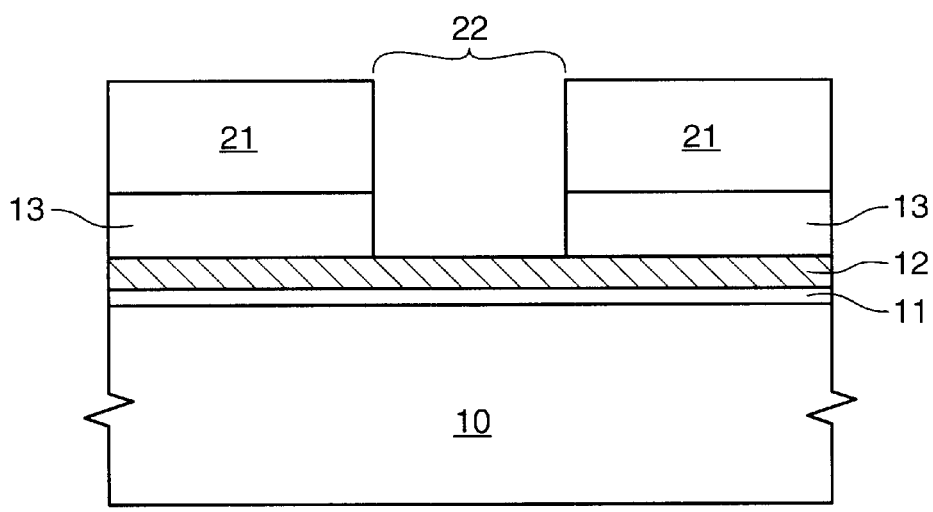
FIG. 2 is a subsequent cross-sectional view taken from FIG. 1 after patterning and etching a via into the silicon nitride to expose the underlying tungsten.

Referring now to FIG. 2, masking material 21 is patterned and then followed by an etch to removed an unmasked portion of dielectric material 13, with the etch stopping once it reaches conductive material 12. This etch results in the formation of via (opening) 22 in preparation for the subsequent formation of a chalcogenide-metal ion material, such as metal ion laced ass material.

Figure 3:
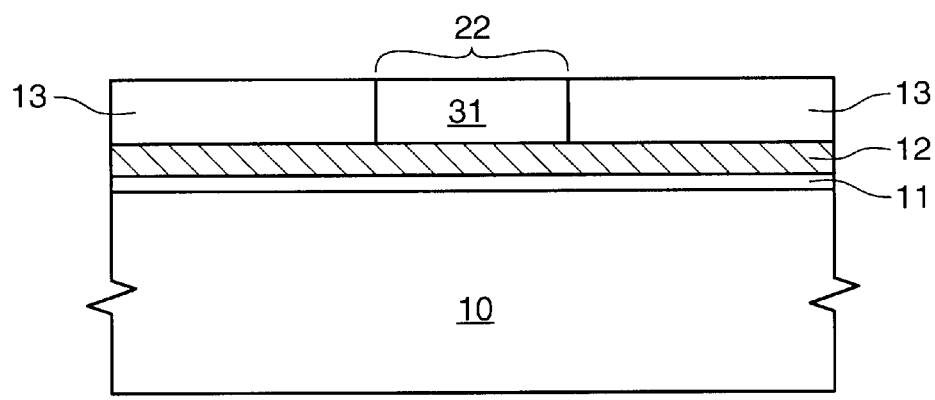
FIG. 3 is a subsequent cross-sectional view taken from FIG. 2 following the formation of a recessed germanium/selenium material into the via.

Referring now to FIG. 3, masking material 21 of FIG. 2 is stripped and glass material 31, such as $Ge_3Se_7$, is formed such as to substantially fill via 22. Glass material 31 is then planarized down to the surface of dielectric material 13, by using an abrasive planarization etching technique, such as chemical mechanical planarization (CMP).

Figure 4:
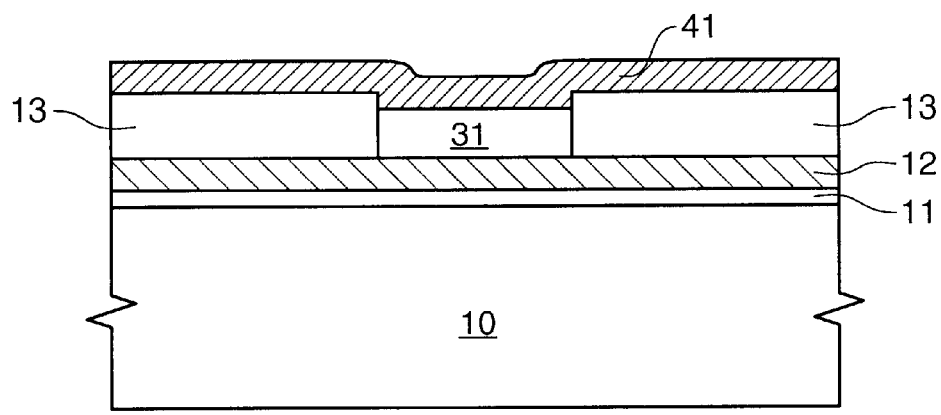
FIG. 4 is a subsequent cross-sectional view taken from FIG. 3 following the formation of a silver layer that overlies the silicon nitride and the recessed germanium/selenium material.

Referring now to FIG. 4, planarized glass material 31 is recessed within via 22, by using either a dry or wet etch. A specific, exemplary wet etch would incorporate the use of $NH_4OH$. A specific, exemplary dry etch would incorporate the use of a fluorine based chemistry, though any dry etch that will remove oxide would be effective. Regardless of the type of etch used, it is desirable that glass material 31 is recessed within via 22 approximately 50% or less (ideally 40–50%) the depth of opening 22, the importance of which will become apparent later in the description of the process.

Next, a metal material 41, such as silver, is formed over dielectric material 13 and recessed glass material 31. Other metal materials that may be used for metal material 41 include tellurium and copper. Then, metal material 41 is either irradiated with ultraviolet light or thermally treated in combination with irradiation to cause sufficient diffusion of metal ions from metal material 41 into recessed glass material 31. For example, metal material 41 may be irradiated for 15 minutes at 4.5 mw/cm$^2$ with the ultraviolet light at 405 nm wavelength. Additionally, the irradiation may be used in combination with a thermal process using the settings of 110° C. for 5–10 minutes. The irradiation process is sufficient to cause the desired diffusion of ion metals; however, the disclosed thermal process by itself is not and thus must be used in combination with the irradiation process. It is preferred that the resultant metal ion concentration in the glass material be approximately 27%±10% , to ensure the formation of a conductive path/dendrite during the eventual programming of the PMC.

Figure 5:
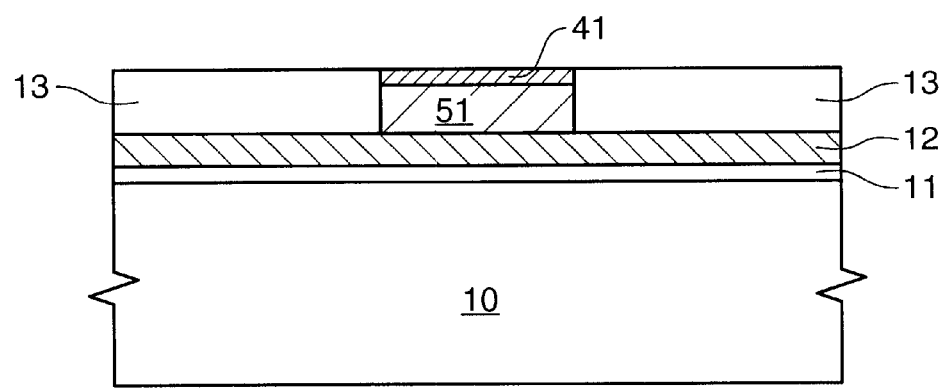
FIG. 5 is a subsequent cross-sectional view taken from FIG. 4 following the planarization of the silver layer to the level of the surface of the silicon nitride.

Referring now to FIG. 5, metal material 41 is planarized back to the top surface of dielectric material 13, leaving a residual layer of metal material 41 on top of recessed glass material 31 (shown in FIG. 4), which is now laced with metal ions to form a metal ion-laced glass material 51. By recessing glass material 31 within via 22 by 40–50% in a previous step, a sufficient amount of metal material 41 is guaranteed to remain after the metal material is planarized so that residual metal material 41 provides an ample source of metal material for diffusion of metal ions into the glass material. Also, residual metal material 41 must be thin enough to allow penetration of the ultraviolet light and the metal ion laced glass material 51 must maintain sufficient thickness in order to function properly as a fast ion conductor.

Figure 6:
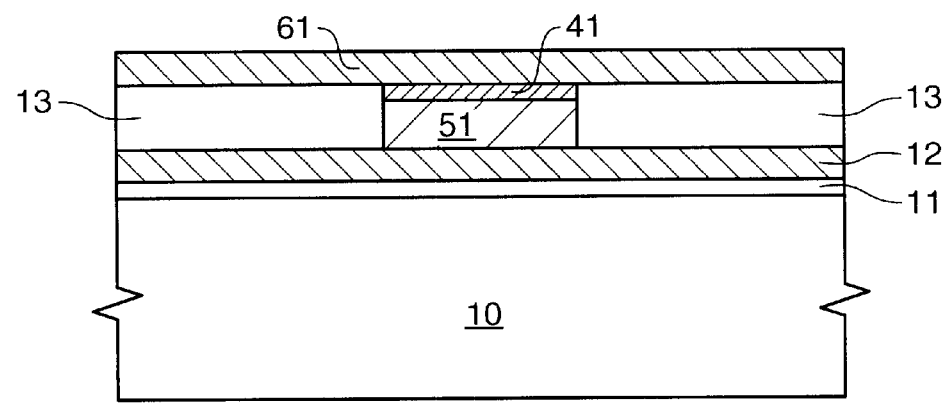
FIG. 6 is a subsequent cross-sectional view taken from FIG. 5 following the formation of a planarized second conductive electrode for the programmable metallization cell.

Referring now to FIG. 6, a second conductive electrode 61 is formed over dielectric material 13 and residual metal material 41 to complete the formation of the PMC. Suitable conductive materials that can be used to form electrode 61 include a conductive material that will effectively alloy with the metal material selected to form metal material 41, of which silver is preferred. In the case where silver is used to form conductive material 41, suitable conductive materials for electrode 61 include tungsten, tantalum, titanium, tantalum nitride, tungsten nitride and so forth. The resulting structure forms a fast ion conductor comprising a chalcogenide-metal ion material (i.e., such as glass layer 51 containing a concentration of silver ions) and at least two conductive electrodes, namely electrodes 12 and 61. The PCRAM is then completed in accordance with fabrication steps used by those skilled in the art.

The PMC is programmed by applying a sufficient voltage across electrodes 12 and 16 to cause the formation of a conductive path/dendrite (or referred to simply as a dendrite) between the two electrodes 12 and 61, by virtue of a conductor (i.e., such as silver) that is now present in metal ion laced glass layer 51. In general terms, the dendrite can grow at any point on the cell starting with the electrode that is opposite the excess metal. In the specific example of the present invention, with the programming voltage applied across electrodes 12 and 61, the dendrite grows vertically at the surface of fast ion conductive material 51 and along the inside of via 22, with the dendrite extending from electrode 12 towards electrode 61.

It is to be understood that, although the present invention has been described with reference to a preferred embodiment, various modifications, known to those skilled in the art, may be made to the disclosed process herein without departing from the invention as recited in the several claims appended hereto.

What is claimed is:

1. A method of forming a programmable cell comprising the steps of:

forming an opening having a depth, in a dielectric material to expose a portion of an underlying first conductive electrode;

forming a chalcogenide-metal ion material in said opening, said chalcogenide metal ion material being recessed approximately 50% or less said depth of said opening; and forming a second conductive electrode overlying said dielectric material and said recessed chalcogenide-metal ion material.

2. The method of claim 1, wherein said step of forming a recessed chalcogenide-metal ion material comprises the steps of:

forming a glass material to be recessed in said opening;

forming a metal material on said glass material within said opening;

diffusing metal ions from said metal material into said glass material.

3. The method of claim 2, wherein said step of forming a glass material to be recessed in said opening comprises forming a glass material in said opening and subsequently removing approximately 40–50% of said glass material resident in said opening.

4. The method of claim 2, wherein said step of diffusing metal ions comprises irradiating said metal material for approximately 15 minutes at 4.5 mw/cm$^2$ with an ultraviolet light having a 405 nm wavelength.

5. The method of claim 4, further comprises thermally heating said metal material at approximately 110° C. for 5–10 minutes during said irradiating.

6. The method of claim 2, wherein said step of diffusing metal ions comprises causing a resultant metal ion concentration in said glass material to be approximately 27%±10%.

7. A method of forming a programmable cell comprising the steps of:

forming an opening having a depth, in a dielectric material to expose a portion of an underlying first conductive electrode;

forming a glass material in said opening, said glass material being recessed approximately 50% or less said depth of said opening;

forming a metal material on said glass material within said opening;

diffusing metal ions from said metal material into said material; and forming a second conductive electrode overlying said dielectric material and said metal material.

8. The method of claim 7, wherein said step of forming a glass material to be recessed in said opening comprises forming a glass material in said opening and subsequently removing approximately 40–50% of said glass material resident in said opening.

9. The method of claim 7, wherein said step of diffusing metal ions comprises irradiating said metal material for approximately 15 minutes at 4.5 mw/cm$^2$ with an ultraviolet light having a 405 nm wavelength.

10. The method of claim 9, further comprises thermally heating said metal material at approximately 110° C. for 5–10 minutes during said irradiating.

11. The method of claim 7, wherein said of diffusing metal ions comprises causing a resultant metal ion concentration in said glass material to be approximately 27%±10%.

12. A method of forming a programmable capacitor dynamic random access memory comprising the steps of:

forming a first conductive electrode on a substrate surface;

forming a dielectric material on said first conductive electrode;

forming an opening having a depth, in said dielectric material to expose a portion of said first conductive electrode;

forming a glass material in said opening, said glass material being recessed approximately 50% or less said depth of said opening;

forming a metal material on said glass material within said opening;

diffusing metal ions from said metal material into said glass material; and forming a second conductive electrode overlying said dielectric material and said metal material.

13. The method of claim 12, wherein said step of forming a glass material to be recessed in said opening comprises forming a glass material in said opening and subsequently removing approximately 40–50% of said material resident in said opening.

14. The method of claim 13, wherein said step of diffusing metal ions comprises irradiating said metal material for approximately 15 minutes at 4.5 mw/cm$^2$ with an ultraviolet light having a 405 nm wavelength.

15. The method of claim 14, further comprises hearing said metal material at approximately 110° C. for 5–10 minutes during irradiating.

16. The method of claim 12, wherein said step of diffusing metal ions comprises causing a resultant metal ion concentration in said glass material to be approximately 27%±10%.

17. A method of forming a programmable capacitor dynamic random access memory comprising the steps of:

forming a first conductive electrode on a substrate surface;

forming a dielectric material on said first conductive electrode;

forming an opening having a depth, in said dielectric material to expose a portion of said first conductive electrode;

forming a glass material recessed by approximately 50% or less said depth of said opening;

forming a metal material on said glass material within said opening;

diffusing metal ions from said metal material into said glass material; and forming a second conductive electrode overlying said dielectric material and said metal material.

18. The method of claim 17, wherein said step of forming a glass material to be recessed in said opening comprises forming a glass material in said opening and subsequently removing approximately 40–50% of said glass material resident in said opening.

19. The method of claim 17, wherein said step of diffusing metal ions comprises irradiating said metal material for approximately 15 minutes at 4.5 mw/cm$^2$ with an ultraviolet light having a 405 nm wavelength.

20. The method of claim 19, further comprises thermally heating said metal material at approximately 110° C. for 5–10 minutes during said irradiating.

21. The method of claim 17, wherein said step of diffusing metal ions comprises causing a resultant metal ion concentration in said glass material to be approximately 27%±10%.

22. A method of forming a programmable capacitor dynamic random access memory comprising the steps of:

forming a first conductive electrode on a substrate surface;

forming a dielectric material on said first conductive electrode;

forming an opening having a depth, in said dielectric material to expose a portion of said first conductive electrode;

forming a glass material recessed by approximately 50% or less said depth of said opening;

forming a silver based material on said glass material within said opening;

diffusing silver ions from said silver based material into said glass material such that a resultant silver ion concentration in said glass material is approximately 27%±10%; and forming a second conductive electrode overlying said dielectric material and said metal material.

23. The method of claim 22, wherein said step of forming a glass material to be recessed in said opening comprises forming a glass material in said opening and subsequently removing approximately 40–50% of said glass material resident in said opening.

24. The method of claim 22, wherein said step of diffusing metal ions comprises irradiating said metal material for approximately 15 minutes at 4.5 mw/cm$^2$ with an ultraviolet light having a 405 nm wavelength.

25. The method of claim 24, further comprises thermally heating said metal material at approximately 110° C. for 5–10 minutes during said irradiating.

* * * * *